(12) United States Patent
Ning et al.

(10) Patent No.: US 10,403,761 B2
(45) Date of Patent: Sep. 3, 2019

(54) ARRAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Ce Ning, Beijing (CN); Wei Yang, Beijing (CN); Xiaohu Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 20 days.

(21) Appl. No.: 15/086,857

(22) Filed: Mar. 31, 2016

(65) Prior Publication Data

US 2016/0315195 A1 Oct. 27, 2016

(30) Foreign Application Priority Data

Apr. 23, 2015 (CN) .......................... 2015 1 0199787

(51) Int. Cl.
*H01L 21/84* (2006.01)
*H01L 29/786* (2006.01)
(Continued)

(52) U.S. Cl.
CPC ...... *H01L 29/7869* (2013.01); *H01L 21/0274* (2013.01); *H01L 27/124* (2013.01);
(Continued)

(58) Field of Classification Search
CPC ............. H01L 29/4908; H01L 29/6675; H01L 29/78648; H01L 27/1251; H01L 27/127;
(Continued)

(56) References Cited

U.S. PATENT DOCUMENTS 5,883,399 A 3/1999 Yin
7,282,782 B2 * 10/2007 Hoffman ............. H01L 29/7869
257/59
(Continued)

FOREIGN PATENT DOCUMENTS

CN 1832194 A 9/2006
CN 101957526 A 1/2011
(Continued)

OTHER PUBLICATIONS

First Chinese office action dated Apr. 26, 2017.

*Primary Examiner* — Mary A Wilczewski
*Assistant Examiner* — Tsz K Chiu
(74) *Attorney, Agent, or Firm* — Dilworth & Barrese, LLP; Michael J. Musella, Esq.

(57) ABSTRACT

An array substrate and a manufacturing method thereof, and a display device are provided. The manufacturing method comprises: forming a first gate metal pattern on a base substrate; forming a gate insulating layer, a first active layer pattern and a source-drain metal pattern on the base substrate on which the first gate metal pattern is formed; forming a first protective layer pattern and a through hole pattern on the base substrate on which the source-drain metal pattern is formed; and forming a second active layer pattern and a pixel electrode pattern on the base substrate on which the first protective layer pattern is formed. Embodiments of the present disclosure solve problems of poor display performance and high cost of the array substrate and achieve effects of improving the display performance and reducing the cost.

11 Claims, 10 Drawing Sheets

(51) Int. Cl.
*H01L 29/66* (2006.01)
*H01L 29/423* (2006.01)
*H01L 29/49* (2006.01)
*H01L 29/24* (2006.01)
*H01L 21/027* (2006.01)
*H01L 29/45* (2006.01)
*H01L 27/12* (2006.01)
*H01L 29/22* (2006.01)

(52) U.S. Cl.
CPC ...... *H01L 27/1225* (2013.01); *H01L 27/1262* (2013.01); *H01L 29/22* (2013.01); *H01L 29/24* (2013.01); *H01L 29/42356* (2013.01); *H01L 29/45* (2013.01); *H01L 29/4908* (2013.01); *H01L 29/4958* (2013.01); *H01L 29/66969* (2013.01); *H01L 29/78606* (2013.01); *H01L 29/78648* (2013.01)

(58) Field of Classification Search
CPC ......... H01L 29/66757; H01L 29/66765; H01L 29/78687
See application file for complete search history.

(56) References Cited

U.S. PATENT DOCUMENTS

| | | | | |
|---|---|---|---|---|
| 8,188,477 B2* | 5/2012 | Miyairi | ............... | H01L 27/1225 257/258 |
| 8,421,081 B2* | 4/2013 | Kato | ..................... | G11C 11/404 257/292 |
| 9,236,405 B2* | 1/2016 | Liu | .................. | H01L 29/66765 |
| 9,768,203 B2* | 9/2017 | Han | .................... | H01L 27/1251 |
| 2001/0030324 A1* | 10/2001 | Morikawa | ......... | H01L 27/14609 257/59 |
| 2004/0188760 A1* | 9/2004 | Skotnicki | ............ | H01L 29/0649 257/347 |
| 2008/0061295 A1* | 3/2008 | Wang | .................... | H01L 27/124 257/59 |
| 2008/0090344 A1 | 4/2008 | Kuwabara | | |
| 2010/0225609 A1* | 9/2010 | Huang | ................ | G02F 1/13338 345/173 |
| 2010/0238095 A1* | 9/2010 | Zhang | ................ | H01L 27/0266 345/82 |
| 2011/0012105 A1* | 1/2011 | Yamazaki | ........... | H01L 27/1225 257/43 |
| 2011/0019117 A1* | 1/2011 | Xue | .................... | G02F 1/13624 349/47 |
| 2013/0221343 A1* | 8/2013 | Son | .................... | H01L 29/78618 257/43 |
| 2014/0145199 A1* | 5/2014 | Shi | ....................... | H01L 29/4908 257/72 |
| 2014/0339542 A1* | 11/2014 | Yamazaki | ........... | H01L 29/7869 257/43 |
| 2015/0021592 A1* | 1/2015 | Seo | .................... | H01L 29/66969 257/43 |
| 2015/0103296 A1* | 4/2015 | Kwak | ................ | G02F 1/134309 349/106 |
| 2015/0187860 A1* | 7/2015 | Seo | ..................... | H01L 27/3276 257/40 |
| 2016/0013326 A1* | 1/2016 | Sun | ........................ | G02F 1/1368 257/71 |
| 2016/0315104 A1* | 10/2016 | Han | .................... | H01L 27/1251 |
| 2017/0162708 A1* | 6/2017 | Ge | .................... | H01L 29/78663 |
| 2017/0229571 A1* | 8/2017 | Choi | ................... | H01L 29/786 |

FOREIGN PATENT DOCUMENTS

| | | |
|---|---|---|
| CN | 102184968 A | 9/2011 |
| CN | 10226990 A | 12/2011 |
| CN | 103531637 A | 1/2014 |
| TW | 201338102 A | 9/2013 |

* cited by examiner

ARRAY SUBSTRATE AND MANUFACTURING METHOD THEREOF, AND DISPLAY DEVICE

TECHNICAL FIELD

Embodiments of the present disclosure relate to an array substrate and a manufacturing method thereof, and a display device.

BACKGROUND

A liquid crystal display is an important flat panel display, and one integral liquid crystal display panel comprises a backlight module, a polarizer, an upper substrate, a lower substrate and liquid crystal molecules filling a cell comprising the two substrates, wherein the upper substrate may be a color filter substrate and the lower substrate may be an array substrate.

Data lines and gate lines crossing transversely and longitudinally are formed on the array substrate. The data lines and the gate lines together define pixel units arranged in a matrix form. Each pixel unit comprises a Thin Film Transistor (TFT) switch and a pixel electrode pattern, wherein the TFT switch comprises a gate metal pattern, a source-drain metal pattern and an active layer pattern; the gate metal pattern is connected with the gate line, the source-drain metal pattern is connected with the data line and the pixel electrode pattern, and the active layer pattern is formed between the source-drain metal pattern and the gate metal pattern. A common electrode pattern may be formed on the array substrate and is used to form an electric field together with the pixel electrode pattern, and a rotating degree of the liquid crystal molecules is controlled by a change of intensity of the electric field between the common electrode pattern and the pixel electrode pattern.

Along with continuous improvement of the performance of the TFT, it is hard for the existing TFT technology to have a breakthrough. Although amorphous Silicon (a-Si), as a material of the active layer, is easy to be fabricated in a large area at low temperature and the technology is relatively mature and becomes the most widely used technology at present, the a-Si material has a band gap of only 1.7V, is opaque to visible light, has light sensitivity in a visible light range and needs to add an opaque metal mask (black matrix) to block light, which results in increased technology complicacy of a TFT-LCD, increase of cost, reduction of an ON state current of a device, and longer pixel charging time; and for large-sized display products, reliability and aperture ratio are reduced, power consumption is increased, and the performance is hard to be further improved, and therefore, the array substrate is relatively poor in display performance and high in cost.

SUMMARY

Embodiments of the present invention provide an array substrate and a manufacturing method thereof, and a display device, which can solve problems of poor display performance and high cost of the array substrate.

One aspect, an embodiment of the present invention provides a manufacturing method of an array substrate, comprising: forming a first gate metal pattern on a base substrate; forming a gate insulating layer, a first active layer pattern and a source-drain metal pattern on the base substrate on which the first gate metal pattern is formed; forming a first protective layer pattern and a through hole pattern on the base substrate on which the source-drain metal pattern is formed; and forming a second active layer pattern and a pixel electrode pattern on the base substrate on which the first protective layer pattern is formed.

Another aspect, an embodiment of the present invention provides an array substrate, comprising: a base substrate; a first gate metal pattern, formed on the array substrate; a gate insulating layer, a first active layer pattern and a source-drain metal pattern, formed on the base substrate on which the first gate metal pattern is formed; a first protective layer pattern, formed on the base substrate on which the source-drain metal pattern is formed; and a second active layer pattern and a pixel electrode pattern, formed on the base substrate on which the first protective layer pattern is formed.

Another aspect, an embodiment of the present invention provides display device, comprising the above mentioned array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In order to clarify the objects, technical solutions and advantages of the present disclosure, the embodiments of the present disclosure will be further described in detail in combination with the drawings.

Figure 1:
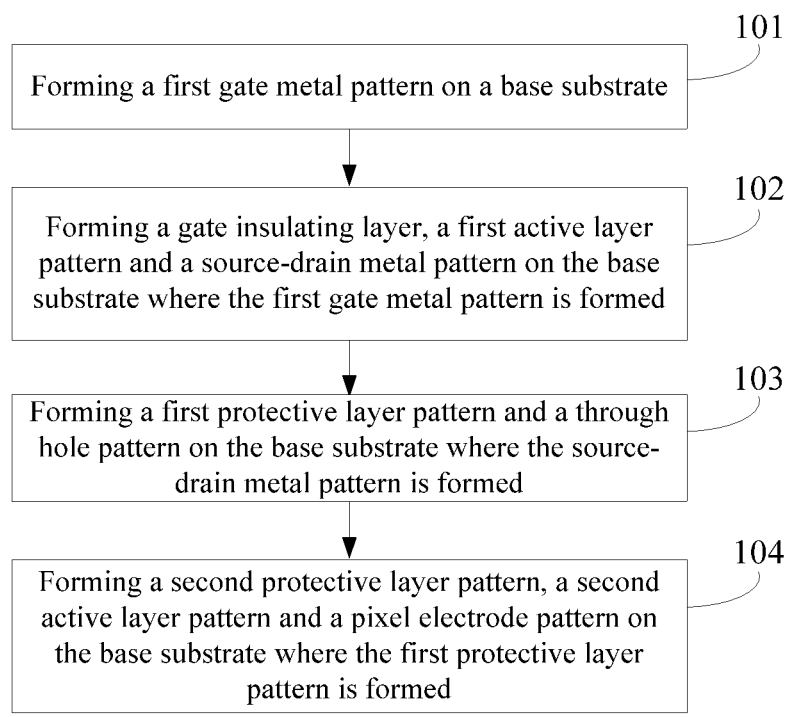
FIG. 1 is a flow chart of a manufacturing method for an array substrate according to an embodiment of the present disclosure.

An embodiment of the present disclosure provides a manufacturing method of an array substrate, as shown in FIG. 1, the method comprises:

Step 101: forming a first gate metal pattern on a base substrate.

Step 102: forming a gate insulating layer, a first active layer pattern and a source-drain metal pattern on the base substrate on which the first gate metal pattern is formed.

Step 103: forming a first protective layer pattern and a through hole pattern on the base substrate on which the source-drain metal pattern is formed.

Step 104: forming a second protective layer pattern, a second active layer pattern and a pixel electrode pattern on the base substrate on which the first protective layer pattern is formed.

In conclusion, with the manufacturing method of the array substrate provided by the embodiment of the present disclosure, by forming the gate insulating layer, the first active layer pattern and the source-drain metal pattern on the base substrate on which the first gate metal pattern is formed, forming the first protective layer pattern and the through hole pattern on the base substrate on which the source-drain metal pattern is formed, and forming the second protective layer pattern, the second active layer pattern and the pixel electrode pattern on the base substrate on which the first protective layer pattern is formed, the array substrate is provided with dual active layer patterns, and compared with the existing array substrate, technology complicacy of a TFT-LCD is reduced, an ON state current of a device is increased, and pixel charging time is shortened; and for a large-sized display product, reliability and aperture ratio are improved, power consumption is reduced, and therefore, the display performance of the array substrate is improved, and the cost is reduced.

Figure 2:
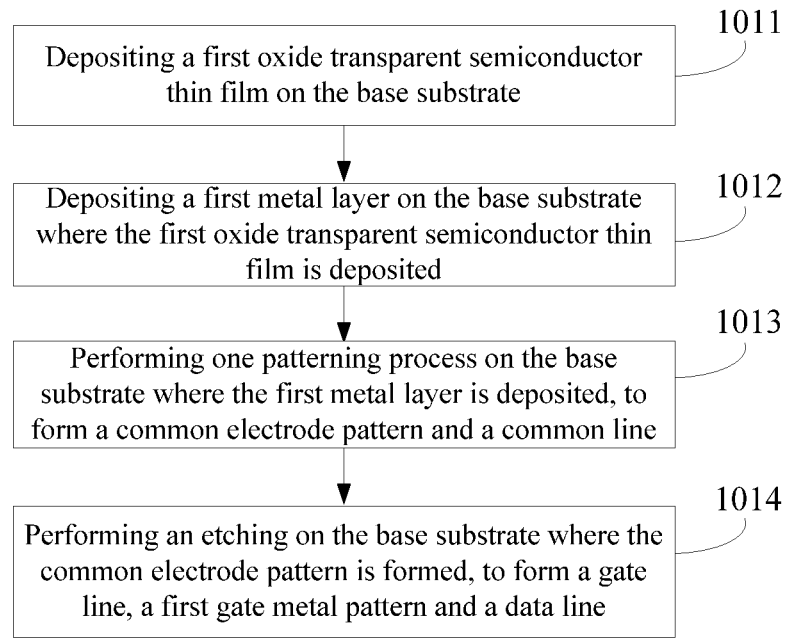
FIG. 2 is a flow chart of a method for forming a first gate metal pattern according to an embodiment of the present disclosure.

Further, as shown in FIG. 2, the step 101 may, for example, include:

Step 1011: depositing a first oxide transparent semiconductor thin film on the base substrate.

A first oxide transparent semiconductor thin film 3002 is deposited on the base substrate, for example, an oxide transparent semiconductor thin film of 30-50 nm is deposited on the base substrate by a magnetron sputtering process. Exemplarily, the oxide transparent semiconductor thin film may be made of Indium Tin Oxide (ITO) or Indium Zinc Oxide (IZO).

Step 1012: depositing a first metal layer on the base substrate on which the first oxide transparent semiconductor thin film is deposited.

Figure 3:
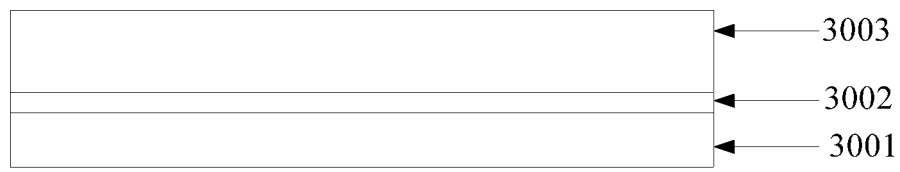
FIG. 3 is a schematic sectional diagram of depositing a first metal layer according to an embodiment of the present disclosure.

As shown in FIG. 3, the first oxide transparent semiconductor thin film 3002 is deposited on the base substrate 3001 according to the step 1011, then a metal layer 3003 of 200-300 nm is deposited by a magnetron sputtering process. Exemplarily, the metal layer may be made of Mo, Al, Cu, Ti or W.

Step 1013: performing one patterning process on the base substrate on which the first metal layer is deposited, forming a common electrode pattern and a common line.

Exemplarily, a layer of photoresist is coated on the base substrate on which the first metal layer 3003 is deposited, and the coated photoresist is exposed by using a gray tone or half tone mask, then the coated photoresist is developed, the first metal layer and the first oxide transparent semiconductor thin film are wet-etched, to form the common electrode pattern and the common line.

Step 1014: performing an etching on the base substrate on which the common electrode pattern is formed, to form a gate line, a first gate metal pattern and a data line.

Figure 4:
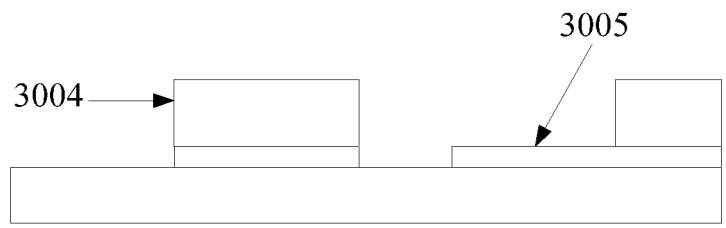
FIG. 4 is a schematic sectional diagram of forming a first gate metal pattern according to an embodiment of the present disclosure.

Exemplarily, ashing the photoresist in step 1013 to remove a part of reserved photoresist and a second wet etching is performed to form the gate line, the first gate metal pattern 3004 and the data line, as shown in FIG. 4, and 3005 in FIG. 4 is the common electrode pattern. It should be noted that the common line, the gate line and the data line formed in the steps 1013 and 1014 are not shown in FIG. 4.

Figure 5:
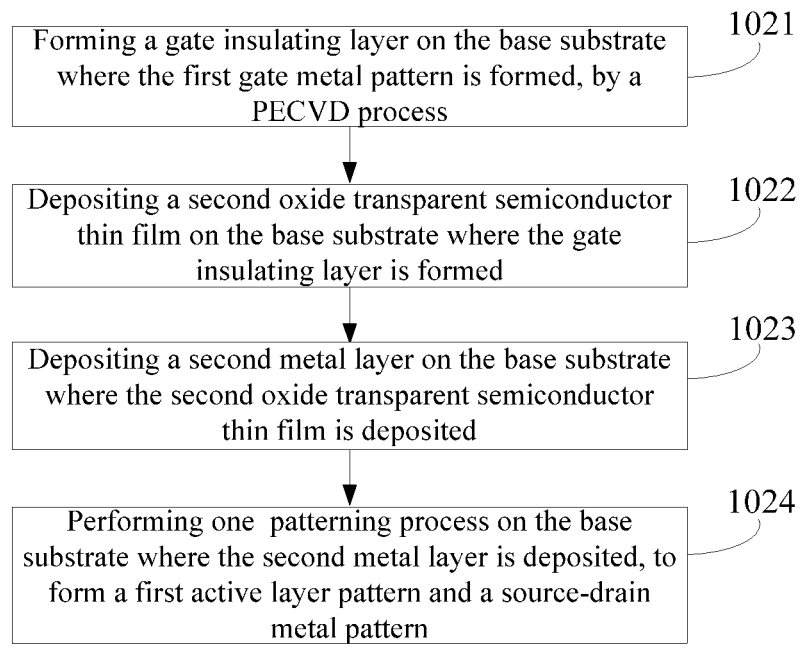
FIG. 5 is a flow chart of a method for forming a gate insulating layer, a first active layer pattern and a source-drain metal pattern according to an embodiment of the present disclosure.

As shown in FIG. 5, the step 102, for example, may include:

Step 1021: forming the gate insulating layer on the base substrate on which the first gate metal pattern is formed, by a PECVD process.

Figure 6:
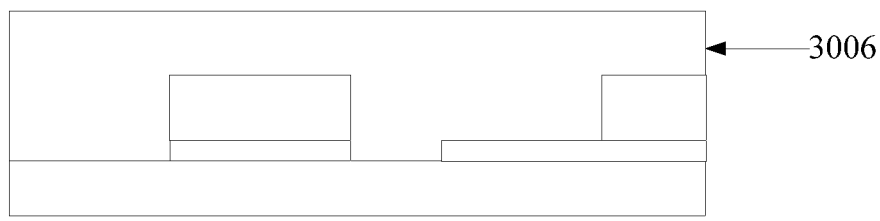
FIG. 6 is a schematic sectional diagram of forming a gate insulating layer according to an embodiment of the present disclosure.

Exemplarily, as shown in FIG. 6, a gate insulating layer 3006 of 300-400 nm is deposited by a plasma enhanced chemical vapor deposition (PECVD) process.

Step 1022: depositing a second oxide transparent semiconductor thin film on the base substrate on which the gate insulating layer is formed.

The second oxide transparent semiconductor thin film is deposited on the gate insulating layer, for example, an oxide transparent semiconductor thin film of 30-50 nm is deposited on the gate insulating layer by a magnetron sputtering process. Exemplarily, the oxide transparent semiconductor thin film may be made of Zinc Oxide (ZnO), IZO, Indium Gallium Zinc Oxide (IGZO) or Indium-Tin-Zinc-Oxide (ITZO). In addition, the oxide transparent semiconductor thin film may be made of an amorphous Silicon (a-Si) fabricated by using a PECVD.

Step 1023: depositing a second metal layer on the base substrate on which the second oxide transparent semiconductor thin film is deposited.

Based on the step 1022, a metal layer of 200-300 nm is deposited again by, for example, a magnetron sputtering process. Exemplarily, the metal layer may be made of Mo, Al, Cu, Ti or W.

Step 1024: performing one patterning process on the base substrate on which the second metal layer is deposited, to form a first active layer pattern and a source-drain metal pattern.

Figure 7:
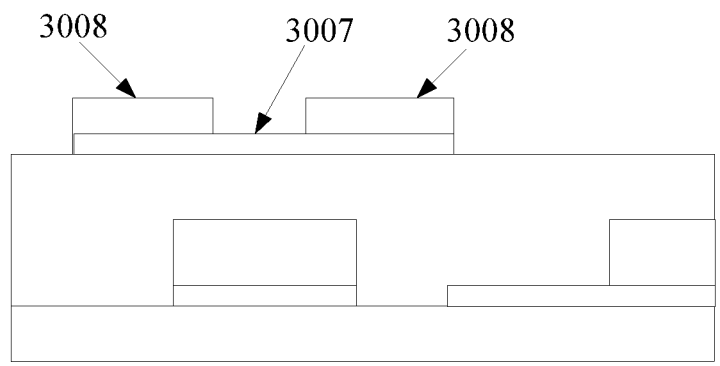
FIG. 7 is a schematic sectional diagram of forming a first active layer pattern and a source-drain metal pattern according to an embodiment of the present disclosure.

Exemplarily, the base substrate on which the second metal layer is deposited is coated with a layer of photoresist, and the coated photoresist is exposed by using a gray tone or half tone mask, then the coated photoresist is developed and etched to form a first active layer pattern 3007 and a source-drain metal pattern 3008, as shown in FIG. 7. The source-drain metal pattern at least comprises a source metal pattern and a drain metal pattern.

Figure 8:
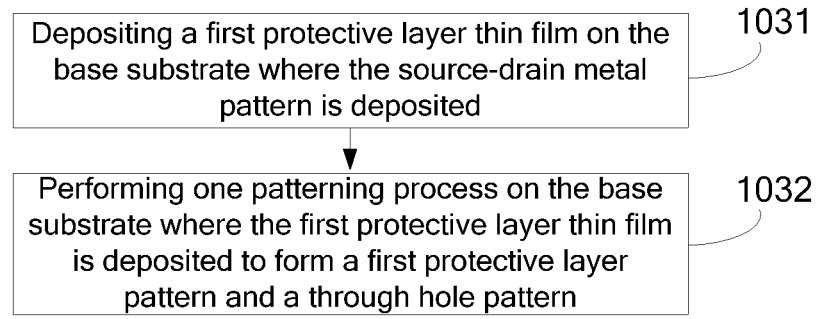
FIG. 8 is a flow chart of a method for forming a first protective layer pattern and a through hole pattern according to an embodiment of the present disclosure.

As shown in FIG. 8, the step 103, for example, may include:

Step 1031: depositing a first protective layer thin film on the base substrate on which the source-drain metal pattern is deposited.

Exemplarily, a protective layer thin film may be deposited by, for example, a PECVD process.

Step 1032: performing one patterning process on the base substrate on which the first protective layer thin film is deposited to form a first protective layer pattern and a through hole pattern.

Figure 9:
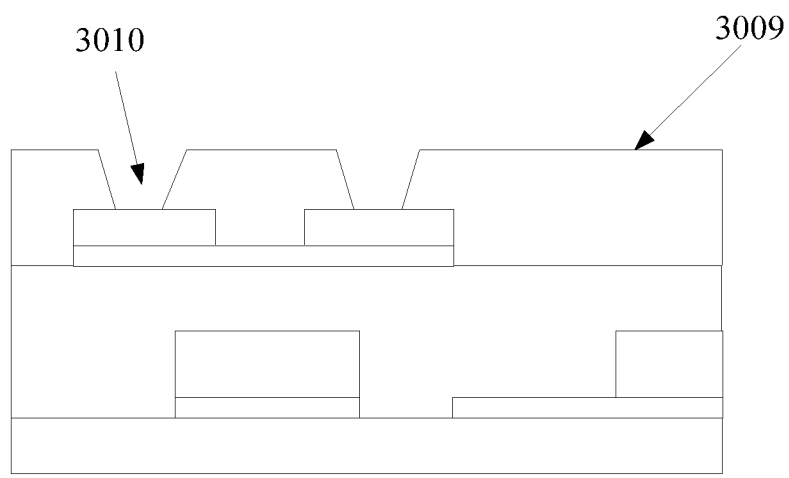
FIG. 9 is a schematic sectional diagram of forming a first protective layer pattern and a through hole pattern according to an embodiment of the present disclosure.

Exemplarily, the base substrate on which the first protective layer thin film is deposited is subjected to steps of coating photoresist, exposing, developing and etching, to form a first protective layer pattern 3009 and a through hole pattern 3010, as shown in FIG. 9.

Figure 10:
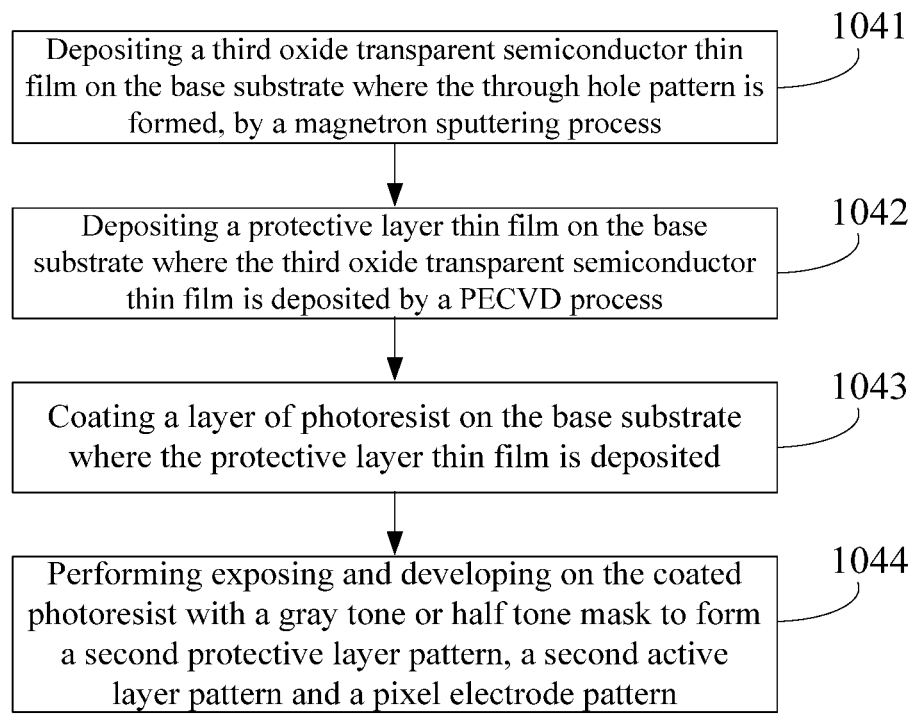
FIG. 10 is a flow chart of a method for forming a second protective layer pattern, a second active layer pattern and a pixel electrode pattern according to an embodiment of the present disclosure.

In one aspect, the step 104 of forming the second protective layer pattern, the second active layer pattern and the pixel electrode pattern by one patterning process, as shown in FIG. 10, for example, may include:

Step 1041: depositing a third oxide transparent semiconductor thin film on the base substrate on which the through hole pattern is formed, by, for example, a magnetron sputtering process.

Figure 11:
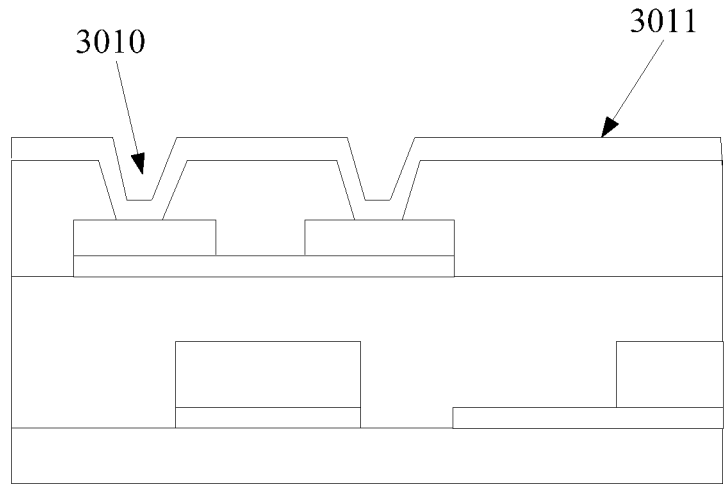
FIG. 11 is a schematic sectional diagram of depositing a third oxide transparent semiconductor thin film according to an embodiment of the present disclosure.

As shown in FIG. 11, a third oxide transparent semiconductor thin film 3011 is deposited on the through hole pattern 3010, for example, a layer of oxide transparent semiconductor thin film of 30 nm-50 nm is deposited on the through hole pattern by a magnetron sputtering process. Exemplarily, the oxide transparent semiconductor thin film may be made of ZnO, IZO, IGZO or ITZO.

Step 1042: depositing a protective layer thin film on the base substrate on which the third oxide transparent semiconductor thin film is deposited by, for example, a PECVD process.

Figure 12:
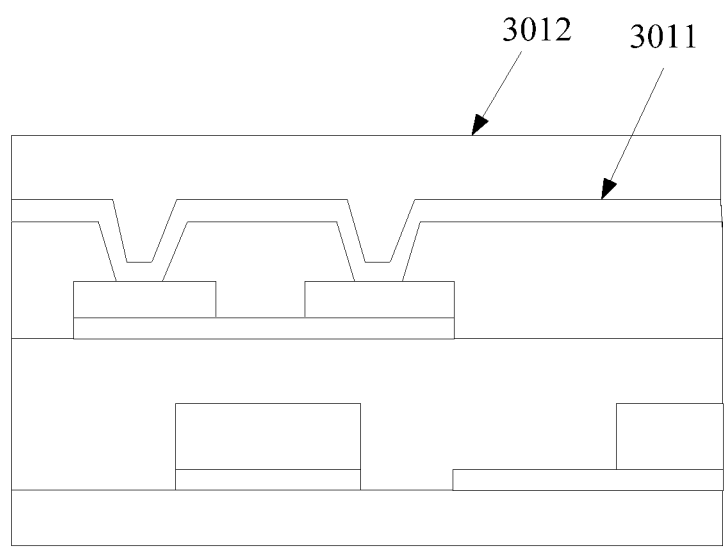
FIG. 12 is a schematic sectional diagram of depositing a protective layer thin film according to an embodiment of the present disclosure.

As shown in FIG. 12, a protective layer thin film 3012 is deposited on the base substrate on which the third oxide transparent semiconductor thin film 3011 is deposited by, for example, a PECVD process.

Step 1043: coating a layer of photoresist on the base substrate on which the protective layer thin film is deposited.

Figure 13:
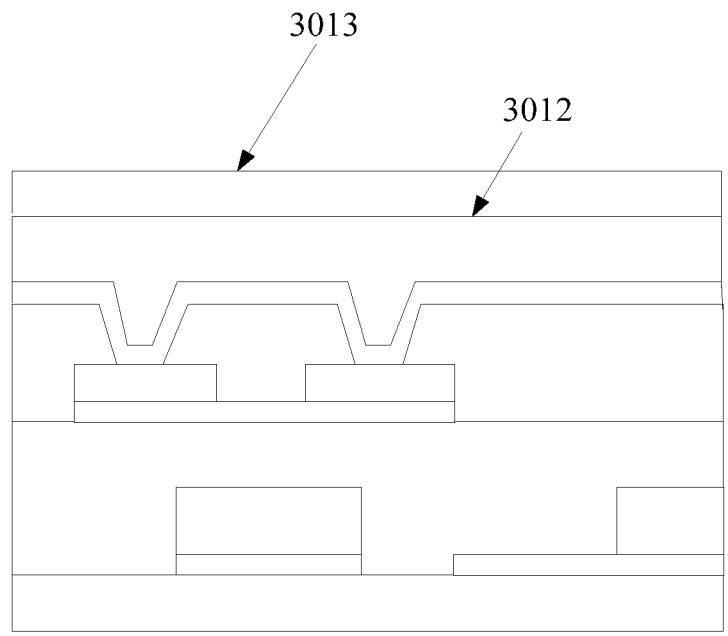
FIG. 13 is a schematic sectional diagram of coating photoresist according to an embodiment of the present disclosure.

As shown in FIG. 13, the base substrate on which the protective layer thin film 3012 is deposited is coated with a layer of photoresist 3013.

Step 1044: performing exposing and developing on the coated photoresist with a gray tone mask or half tone mask, to form a second protective layer pattern, a second active layer pattern and a pixel electrode pattern.

Figure 14:
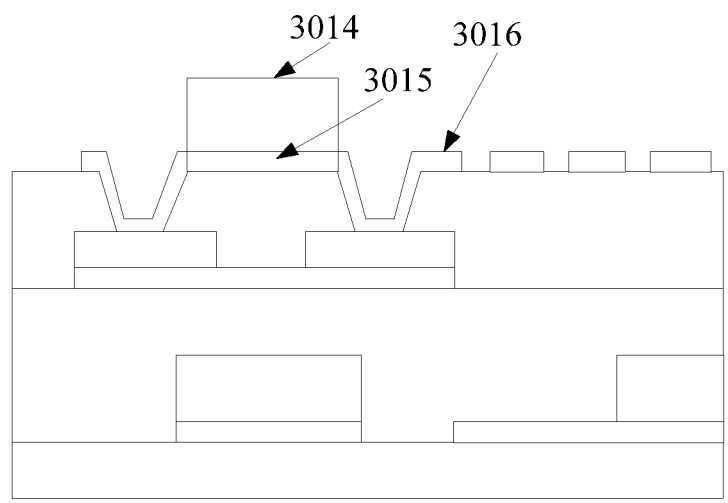
FIG. 14 is a schematic sectional diagram of forming a second protective layer pattern, a second active layer pattern and a pixel electrode pattern according to an embodiment of the present disclosure.

A second protective layer pattern 3014, a second active layer pattern 3015 and a pixel electrode pattern 3016 formed with a gray tone mask or a half tone mask by performing exposing and developing on the coated photoresist are as shown in FIG. 14.

Finally, based on the step 1044, an ion injection or plasma treatment process is used to convert the third oxide transparent semiconductor thin film of the pixel electrode to a transparent conductive thin film.

Figure 15:
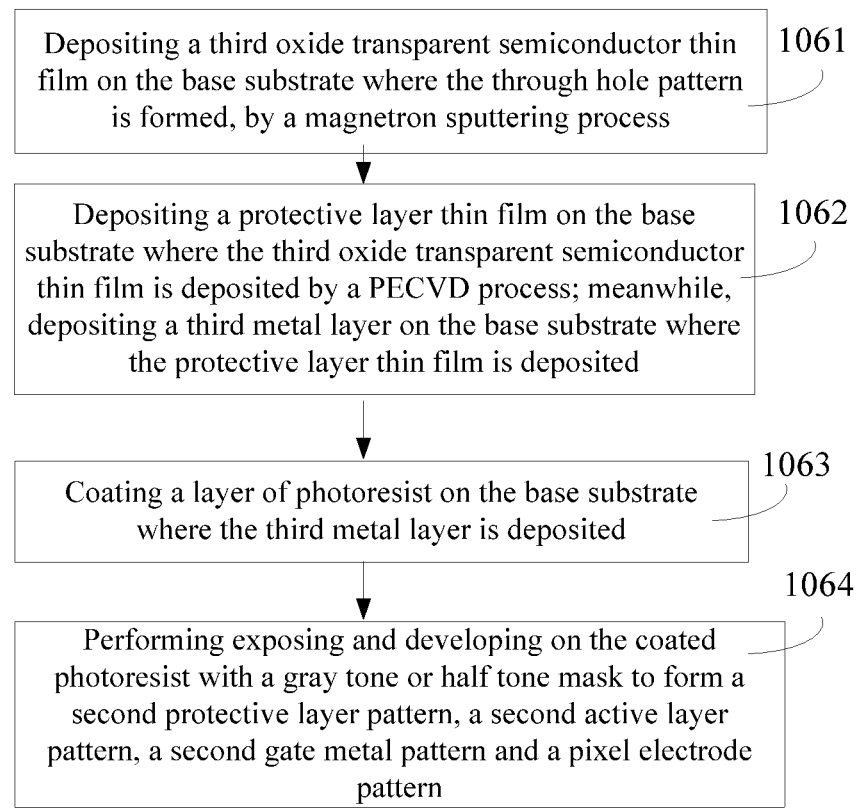
FIG. 15 is a flow chart of another method for forming a second protective layer pattern, a second active layer pattern and a pixel electrode pattern according to an embodiment of the present disclosure.

In another aspect, the step 104 of forming the second protective layer pattern, the second active layer pattern, the second gate metal pattern and the pixel electrode pattern by one patterning process, as shown in FIG. 15, for example, may include:

Step 1061: depositing a third oxide transparent semiconductor thin film on the base substrate on which the through hole pattern is formed, by a magnetron sputtering process.

An exemplary process of the step 1061 may refer to the step 1041.

Step 1062: depositing a protective layer thin film on the base substrate on which the third oxide transparent semiconductor thin film is deposited by, for example, a PECVD process; meanwhile, depositing a third metal layer on the base substrate on which the protective layer thin film is deposited.

Figure 16:
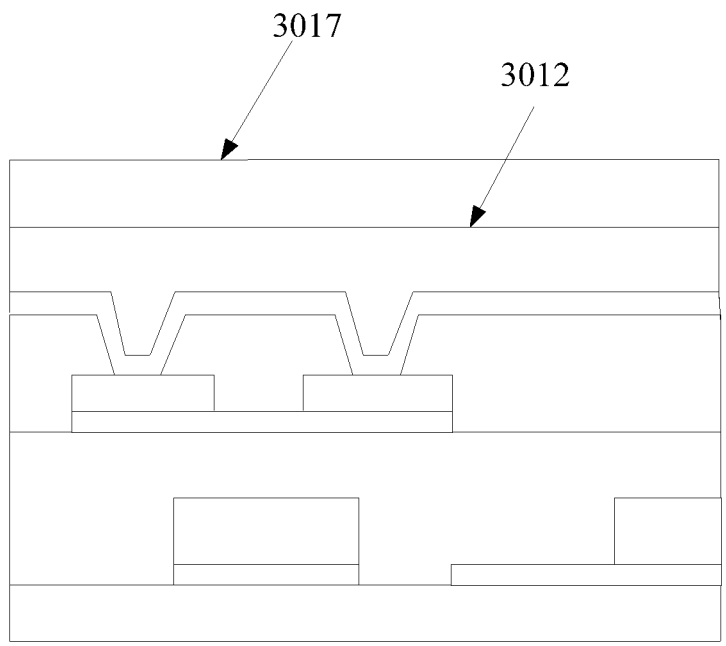
FIG. 16 is a schematic sectional diagram of depositing a third metal layer according to an embodiment of the present disclosure.

An exemplary process of depositing a protective layer thin film on the base substrate on which the third oxide transparent semiconductor thin film is deposited by, for example, a PECVD process may refer to the step 1042. The third metal layer is deposited by, for example, a PECVD process, as shown in FIG. 16, a third metal layer 3017 is deposited on the base substrate on which the protective layer thin film 3012 is deposited.

Step 1063: coating a layer of photoresist on the base substrate on which the third metal layer is deposited.

Figure 17:
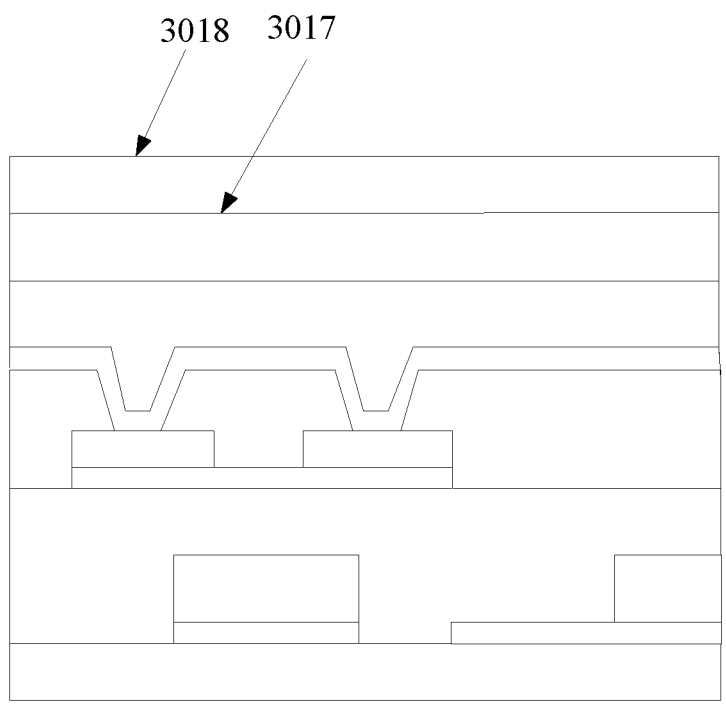
FIG. 17 is another schematic sectional diagram of coating photoresist according to an embodiment of the present disclosure.

As shown in FIG. 17, the base substrate on which the third metal layer 3017 is deposited is coated with a layer of photoresist 3018.

Step 1064: performing exposing and developing on the coated photoresist with a gray tone or half tone mask to form a second protective layer pattern, a second active layer pattern, a second gate metal pattern and a pixel electrode pattern.

Figure 18:
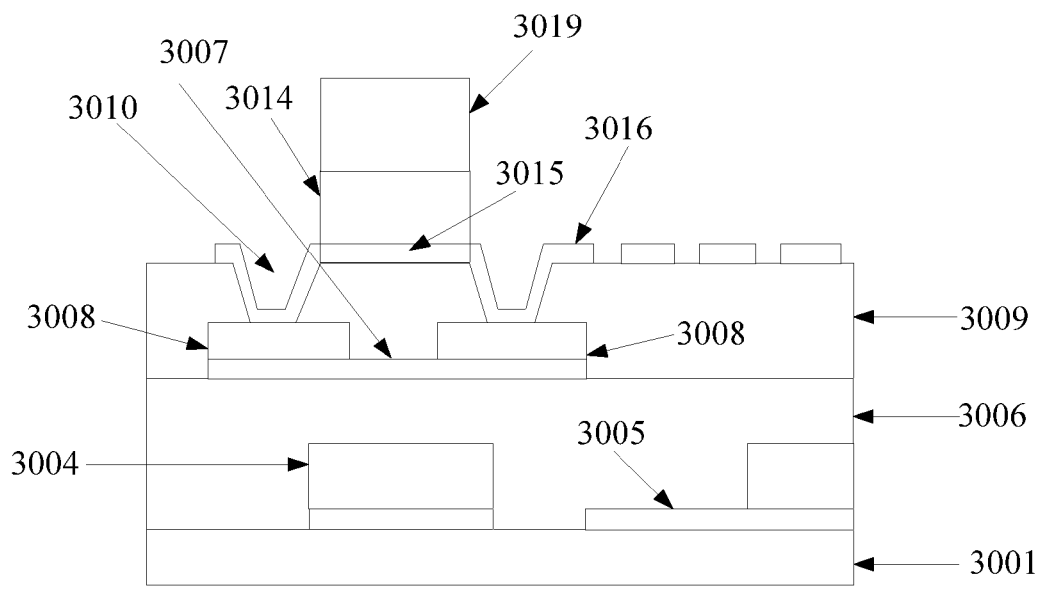
FIG. 18 is a schematic sectional diagram of forming a second protective layer pattern, a second active layer pattern, a second gate metal pattern and a pixel electrode pattern according to an embodiment of the present disclosure.

The second protective layer pattern 3014, the second active layer pattern 3015, a second gate metal pattern 3019 and the pixel electrode pattern 3016 formed by performing exposing and developing on the coated photoresist with the gray tone or half tone mask is shown in FIG. 18. In addition, in FIG. 18, 3001 denotes the base substrate, 3004 denotes the first gate metal pattern, 3006 denotes the gate insulating layer, 3007 denotes the first active layer pattern, 3008 denotes the source-drain metal pattern, 3009 denotes the first protective layer pattern, 3010 denotes the through hole pattern and 3005 denotes the common electrode pattern.

It should be noted that by depositing the third metal layer, the formed second gate metal pattern can be used for ensuring and controlling the normal performances of the second active layer pattern.

It should be noted that an order of the steps of the manufacturing method for the array substrate provided in the embodiments of the present disclosure may be properly adjusted, the number of the steps may be correspondingly increased or reduced according to situations, changed methods easily conceived by any skilled in the art in the technical scope disclosed in the present disclosure should fall within the protection scope of the present disclosure and are not repeated herein.

In conclusion, according to the manufacturing method of the array substrate provided in an embodiment of the present disclosure, by forming the gate insulating layer, the first active layer pattern and the source-drain metal pattern on the base substrate on which the first gate metal pattern is formed, forming the first protective layer pattern and the through hole pattern on the base substrate on which the source-drain metal pattern is formed, and forming the second protective layer pattern, the second active layer pattern and the pixel electrode pattern on the base substrate on which the first protective layer pattern is formed, the array substrate is provided with dual active layer patterns, and compared with the existing array substrate, technology complicacy of a TFT-LCD is reduced, an ON state current of a device is increased, and pixel charging time is shortened; and for a large-sized display product, reliability and aperture ratio are improved, power consumption is reduced, and therefore, the display performance of the array substrate is improved, and the cost is reduced.

Figure 19:
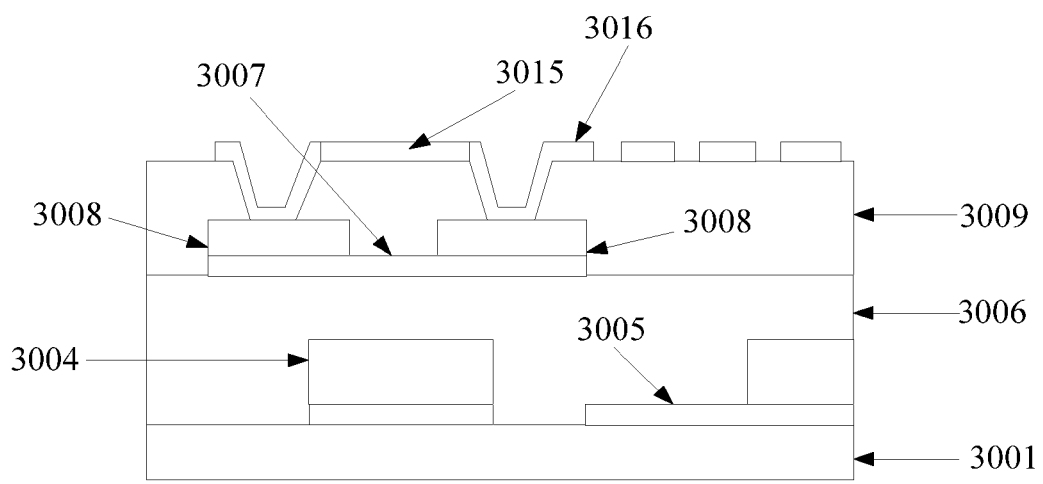
FIG. 19 is a schematic sectional diagram of an array substrate according to an embodiment of the present disclosure.

An embodiment of the present disclosure provides an array substrate, as shown in FIG. 19, the array substrate may comprise: a base substrate 3001; a first gate metal pattern 3004 formed on the base substrate 3001; a gate insulating layer 3006, a first active layer pattern 3007 and a source-drain metal pattern 3008 formed on the base substrate on which the first gate metal pattern 3004 is formed; a first protective layer pattern 3009 formed on the base substrate on which the source-drain metal pattern 3008 is formed; and a second active layer pattern 3015 and a pixel electrode pattern 3016 formed on the base substrate on which the first protective layer pattern 3009 is formed. In the diagram, 3005 denotes a common electrode pattern.

In conclusion, with the array substrate provided in an embodiment of the present disclosure, by forming the gate insulating layer, the first active layer pattern and the source-drain metal pattern on the base substrate on which the first gate metal pattern is formed, forming the first protective layer pattern and the through hole pattern on the base substrate on which the source-drain metal pattern is formed, and forming the second active layer pattern and the pixel electrode pattern on the base substrate on which the first protective layer pattern is formed, the array substrate is provided with dual active layer patterns, and compared with the existing array substrate, technology complicacy of a TFT-LCD is reduced, an ON state current of a device is increased, and pixel charging time is shortened; and for a large-sized display product, reliability and aperture ratio are improved, power consumption is reduced, and therefore, the display performance of the array substrate is improved, and the cost is reduced.

An embodiment of the present disclosure provides another array substrate, as shown in FIG. 18, the array substrate may comprise: a base substrate 3001; a first gate metal pattern 3004 formed on the base substrate 3001; a gate insulating layer 3006, a first active layer pattern 3007 and a source-drain metal pattern 3008 formed on the base substrate on which the gate metal pattern 3004 is formed; a first protective layer pattern 3009 formed on the base substrate on which the source-drain metal pattern 3008 is formed; a second active layer pattern 3015 and a pixel electrode pattern 3016 formed on the base substrate on which the first protective layer pattern 3009 is formed; a second protective layer pattern 3014 formed on the base substrate on which the second active layer pattern 3015 is formed; a second gate metal pattern 3019 formed on the base substrate on which the second protective layer pattern 3014 is formed; a through hole pattern 3010 formed on the base substrate on which the first protective layer pattern 3009 is formed; and a common electrode pattern 3005, a common line, a gate line and a data line formed on the base substrate (the common line, the gate line and the data line are not shown in FIG. 18).

In conclusion, with the array substrate provided in an embodiment of the present disclosure, by forming the gate insulating layer, the first active layer pattern and the source-drain metal pattern on the base substrate on which the first gate metal pattern is formed, forming the first protective layer pattern and the through hole pattern on the base substrate on which the source-drain metal pattern is formed, and forming the second protective layer pattern, the second active layer pattern and the pixel electrode pattern on the base substrate on which the first protective layer pattern is formed, the array substrate is provided with dual active layer patterns, and compared with the existing array substrate, technology complicacy of a TFT-LCD is reduced, an ON state current of a device is increased, and pixel charging time is shortened; and for a large-sized display product, reliability and aperture ratio are improved, power consumption is reduced, and therefore, the display performance of the array substrate is improved, and the cost is reduced.

With the array substrate and the manufacturing method thereof according to the embodiments of the present disclosure, the manufacturing method is extremely simple and a simple complete process thereof still adopt four patterning processes to finish an Advanced Super Dimension Switch (ADSDS) structure, and ADSDS is briefly referred to as ADS. An ADS technology of dual active layers can improve picture quality of a TFT-LCD product, and has advantages of high resolution, high transmittance, low power consumption, wide viewing angle, high aperture ratio, low aberration and the like. The dual active layer structure provided in the embodiments of the present disclosure can greatly increase the ON state current of a device and shorten pixel charging time, has great advantages for a large-sized high Pixels Per Inch (PPI) high-frequency product, and ensures stability of performance and cost.

An embodiment of the present disclosure provides a display device, and the display device may comprise the array substrate as shown in FIG. 18 or FIG. 19. The display device comprises a liquid crystal panel, a liquid crystal television, a cellphone, a tablet computer, a navigator, etc. With the array substrate provided in an embodiment of the present disclosure, by forming the gate insulating layer, the first active layer pattern and the source-drain metal pattern on the base substrate on which the first gate metal pattern is formed, forming the first protective layer pattern and the through hole pattern on the base substrate on which the source-drain metal pattern is formed, and forming the second protective layer pattern, the second active layer pattern and the pixel electrode pattern on the base substrate on which the first protective layer pattern is formed, the array substrate is provided with dual active layer patterns, and compared with the existing array substrate, technology complicacy of a TFT-LCD is reduced, an ON state current of a device is increased, and the pixel charging time is shortened; and for a large-sized display product, reliability and aperture ratio are improved, power consumption is reduced, and therefore, the display performance of the array substrate is improved, and the cost is reduced.

Those skilled in the art can clearly learn that for the purpose of convenience and concise description, a specific forming process of the above described device can refer to a corresponding process in the embodiments of the forgoing method, and is not repeated herein.

Above is merely preferably embodiments of the present disclosure rather than limitative of the present disclosure, and any modification, equivalent substitution and improvement within the spirit and principle of the present disclosure should fall into the protection scope of the present disclosure.

The application claims priority of Chinese Patent Application No. 201510199787.3 filed on Apr. 23, 2015, the disclosure of which is incorporated herein by reference in its entirety as part of the present application.

The invention claimed is:

1. A manufacturing method of an array substrate, comprising:
   forming a first gate metal pattern on a base substrate;
   forming a gate insulating layer, a first active layer pattern and a source-drain metal pattern on the base substrate on which the first gate metal pattern is formed;
   forming a first protective layer pattern and a through hole pattern on the base substrate on which the source-drain metal pattern is formed; and
   forming a second active layer pattern and a pixel electrode pattern by etching a same thin film layer through a same patterning process on the base substrate on which the first protective layer pattern is formed, the second active layer pattern and the pixel electrode pattern being directly formed on the first protective layer pattern, and the second active layer pattern and the pixel electrode pattern being in direct contact with each other.

2. The method according to claim 1, wherein the forming a second active layer pattern and a pixel electrode pattern by etching a same thin film layer though a same patterning process on the base substrate on which the first protective layer pattern is formed, further comprises:
   forming a second protective layer pattern on the base substrate on which the first protective layer pattern is formed.

3. The method according to claim 1, wherein the forming a first gate metal pattern on the base substrate, comprises:
   depositing a first oxide transparent semiconductor thin film on the base substrate;
   depositing a first metal layer on the base substrate on which the first oxide transparent semiconductor thin film is deposited;
   performing one patterning process on the base substrate on which the first metal layer is deposited, to form a common electrode pattern and a common line; and
   performing an etching on the base substrate on which the common electrode pattern is formed, to form a gate line, the first gate metal pattern and a data line.

4. The method according to claim 3, wherein,
   the first oxide transparent semiconductor thin film is made of ITO or IZO; and
   the first metal layer is made of Mo, Al, Cu, Ti or W.

5. The method according to claim 1, wherein the forming a gate insulating layer, a first active layer pattern and a source-drain metal pattern on the base substrate on which the first gate metal pattern is formed, comprises:
   forming the gate insulating layer on the base substrate on which the first gate metal pattern is formed;
   depositing a second oxide transparent semiconductor thin film on the base substrate on which the gate insulating layer is formed;
   depositing a second metal layer on the base substrate on which the second oxide transparent semiconductor thin film is deposited; and
   performing one patterning process on the base substrate on which the second metal layer is deposited, to form the first active layer pattern and the source-drain metal pattern.

6. The method according to claim 5, wherein
   the second oxide transparent semiconductor thin film is made of ZnO, IZO, IGZO or ITZO; and
   the second metal layer is made of Mo, Al, Cu, Ti or W.

7. The method according to claim 2, wherein the forming a second protective layer pattern, a second active layer pattern and a pixel electrode pattern on the base substrate on which the through hole pattern is formed, comprises:
   depositing a third oxide transparent semiconductor thin film on the base substrate on which the through hole pattern is formed;
   depositing a protective layer thin film on the base substrate on which the third oxide transparent semiconductor thin film is deposited;
   coating a layer of photoresist on the base substrate on which the protective layer thin film is deposited; and
   performing exposing and developing on the coated photoresist with a gray tone mask or a half tone mask, to form the second protective layer pattern, the second active layer pattern and the pixel electrode pattern.

8. The method according to claim 2, wherein the forming a second protective layer pattern, a second active layer pattern and a pixel electrode pattern on the base substrate on which the through hole pattern is formed, comprises:
   depositing a third oxide transparent semiconductor thin film on the base substrate on which the through hole pattern is formed;
   depositing a protective layer thin film on the base substrate on which the third oxide transparent semiconductor thin film is deposited; meanwhile,
   depositing a third metal layer on the base substrate on which the protective layer thin film is deposited;
   coating a layer of photoresist on the base substrate on which the third metal layer is deposited; and
   performing exposing and developing on the coated photoresist with a gray tone mask or a half tone mask, to form the second protective layer pattern, the second active layer pattern, a second gate metal pattern and the pixel electrode pattern.

9. The method according to claim 8, wherein
   the third oxide transparent semiconductor thin film is made of ZnO, IZO, IGZO or ITZO.

10. The method according to claim 7, further comprising: converting the third oxide transparent semiconductor thin film of the pixel electrode pattern into a transparent conductive thin film.

11. The method according to claim 8, further comprising: converting the third oxide transparent semiconductor thin film of the pixel electrode pattern into a transparent conductive thin film.

* * * * *